(12) United States Patent
Makino et al.

(10) Patent No.: US 6,449,133 B1
(45) Date of Patent: Sep. 10, 2002

(54) MAGNETORESISTANCE FILM AND MAGNETIC READ SENSOR

(75) Inventors: Eiji Makino; Satoru Ishii, both of Miyagi; Masafumi Takiguchi, Kanagawa, all of (JP)

(73) Assignee: Sony Corporation, Tokyo (JP)

( * ) Notice: Subject to any disclaimer, the term of this patent is extended or adjusted under 35 U.S.C. 154(b) by 90 days.

(21) Appl. No.: 09/588,291

(22) Filed: Jun. 7, 2000

(30) Foreign Application Priority Data

Jun. 17, 1999 (JP) .......................................... 11-171203

(51) Int. Cl.⁷ ........................... G11B 5/127; G11B 5/33
(52) U.S. Cl. ................................................. 360/324.11
(58) Field of Search .............................. 360/324.1, 324, 360/313, 324.11

(56) References Cited

U.S. PATENT DOCUMENTS

| | | | | |
|---|---|---|---|---|
| 5,909,345 A | * | 6/1999 | Kawawake et al. | 360/324.1 |
| 6,133,732 A | * | 10/2000 | Hayashi | 324/252 |
| 6,181,537 B1 | * | 1/2001 | Gill | 360/324.2 |
| 6,195,240 B1 | * | 2/2001 | Gill | 360/324.11 |
| 6,277,505 B1 | * | 8/2001 | Shi et al. | 427/131 |

* cited by examiner

Primary Examiner—Robert S. Tupper
Assistant Examiner—Julie Anne Watko
(74) Attorney, Agent, or Firm—Sonnenschein, Nath & Rosenthal

(57) ABSTRACT

A magnetoresistance film has an ordered antiferromagnetic layer (1), a fixed magnetic structure portion (2) joined thereto, a non-magnetic conductive layer (3), and a free magnetic layer portion (4) having at least one magnetic layer, the fixed magnetic structure portion (2) having provided therein an amorphous magnetic layer (5). The magnetoresistance film is thereby constructed such that the amorphous magnetic layer (5) and the non-magnetic conductive layer (3) are joined to each other with a crystalline ferromagnetic intermediate layer (61) existing in between. Thereby, the fixed magnetic structure portion of a spin valve construction has therein the amorphous magnetic layer to thereby achieve the enhancement of the magneto-resistance change rate and the improvement of the heat resistance of the resulting magnetoresistance film.

18 Claims, 6 Drawing Sheets

MAGNETORESISTANCE FILM AND MAGNETIC READ SENSOR

BACKGROUND OF THE INVENTION

1. Field of the Invention

The present invention relates to a magnetoresistance film and a magnetic read sensor. Namely, the invention concerns a magnetoresistance film having a so-called "spin valve" construction and a magnetic read sensor using the same.

2. Detailed Description of the Prior Art

Conventionally, as a fixed magnetic layer joined to an antiferromagnetic layer in the "spin valve" film, there is generally used a single-layer NiFe/CoFe/CoFeB film that consists of crystalline ferromagnetic material having a fcc structure.

By the way, as an antiferromagnetic layer, in the "spin valve" film using an ordered antiferromagnetic material, it is needed to perform high-temperature heat treatment for the purpose of ordering transformation.

However, in the conventional spin valve film, there was the problem that due to this high-temperature heat treatment the linear response characteristic of the magnetoresistance characteristic decreased and simultaneously with this the layer-to-layer insulative-layer-coupling magnetic field Hf also increased.

A sensor that uses an ordered antiferromagnetic layer is disclosed in Japanese Patent Application Laid-Open No. 6-76247.

On the other hand, a magnetoresistance film that uses an amorphous magnetic alloy as a fixed magnetic layer is disclosed in Japanese Patent Application Laid-Open No. 8-203035. This magnetoresistance film is intended to enhance the soft-magnetic characteristic of its free magnetic layer to thereby increase the magneto-resistance change rate in a low magnetic field and also improve the heat resistance.

SUMMARY OF THE INVENTION

In view of the above, an object of the present invention is to provide a magnetoresistance film of a structure using an ordered antiferromagnetic material as its antiferromagnetic layer and using an amorphous magnetic alloy in its fixed magnetic structure portion, which even with a high-temperature heat treatment enables ensuring a sufficiently high magnetoresistance change rate ("MR rate", hereinafter) as well as obtaining a high heat resistance, and a magnetic read sensor.

Namely, the present invention provides a spin valve type magnetoresistance film and a magnetic read sensor, the magneto-sensitive portion of that is constructed using this magnetoresistance film. In this construction of the present invention, when the fixed magnetic structure portion in the spin valve film has an amorphous magnetic layer, studies have been made of the fact that the joint between this amorphous magnetic layer and a non-magnetic conductive layer has serious effects upon the MR rate and the heat resistance. On the basis thereof, the present invention provides a magnetoresistance film that has been improved in the MR rate and in the heat resistance, and a magnetic read sensor.

To attain the above object, the magnetoresistance film of the present invention has an ordered antiferromagnetic layer, a fixed magnetic structure portion joined thereto, a non-magnetic conductive layer, and a free magnetic layer portion having at least one magnetic layer, the fixed magnetic structure portion having provided therein an amorphous magnetic layer, whereby, by providing a crystalline ferromagnetic intermediate layer in the fixed magnetic structure portion, the amorphous magnetic layer and the non-magnetic conductive layer are joined to each other with this crystalline ferromagnetic intermediate layer existing in between.

Also, the magnetic read sensor according to the present invention has a magneto-sensitive portion, and it is constructed that this magneto-sensitive portion has the magnetoresistance film of the present invention.

As described above, the magnetoresistance film of the present invention has a construction wherein its fixed magnetic structure portion has an amorphous magnetic layer. And by making up a construction wherein the amorphous magnetic layer and the non-magnetic conductive layer are joined to each other with a crystalline ferromagnetic intermediate layer existing in between, it has been confirmed that the MR rate and the heat resistance are improved.

And, the magnetic read sensor of the present invention enhances the magnetic read sensitivity and the heat resistance, accordingly the reliability on itself, by constructing its magneto-sensitive portion with the use of the above-described magnetoresistance film.

DETAILED DESCRIPTION OF THE PREFERRED EMBODIMENTS

Figure 1:
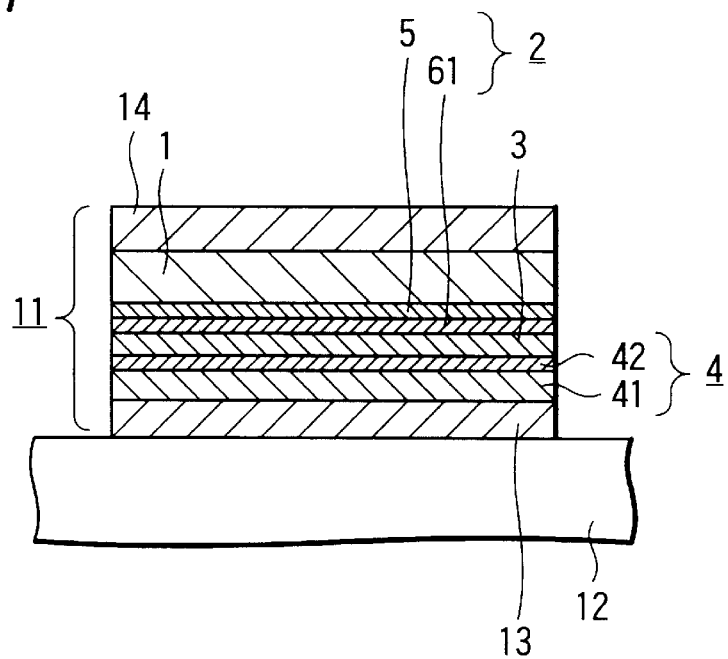
FIG. 1 is a schematic sectional view illustrating an example of a magnetoresistance film according to the present invention.

As has an example of its one embodiment illustrated in a schematic sectional view of FIG. 1, a magnetoresistance film 11 according to the present invention is the one that has a so-called "spin-valve" construction. And the magnetoresistance film 11 has an ordered antiferromagnetic layer 1, a fixed magnetic structure portion 2 joined thereto, a non-magnetic conductive layer 3, and a free magnetic layer portion 4 having at least one piece of magnetic layer. And in this construction the fixed magnetic structure portion 2 is a magnetoresistance film which has an amorphous magnetic layer 5 and, between the amorphous magnetic layer 5 and the non-magnetic conductive layer 3 there is disposed a first crystalline ferromagnetic intermediate layer 61.

Figure 2:
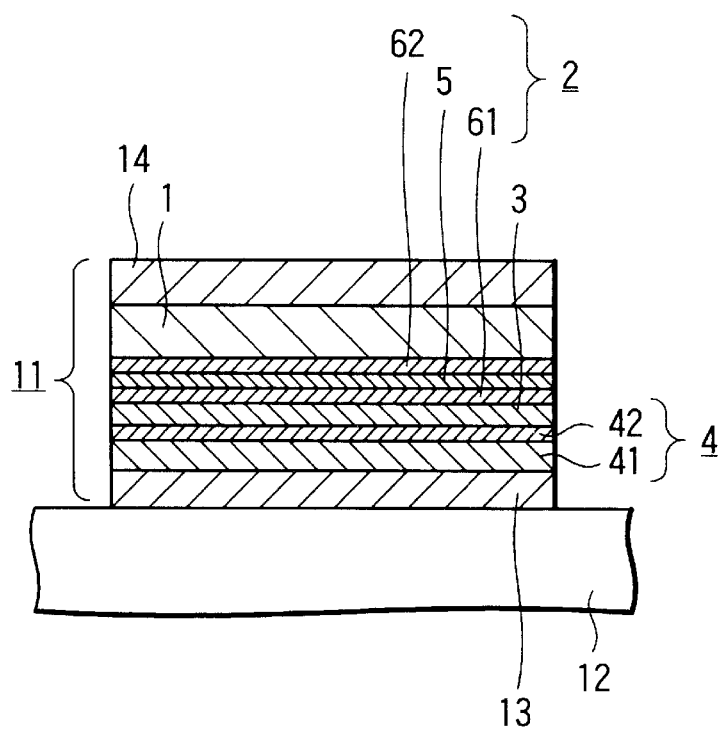
FIG. 2 is a schematic sectional view illustrating another example of the magnetoresistance film according to the present invention.

Also, as has an example of its another embodiment illustrated in a schematic sectional view of FIG. 2, the magnetoresistance film 11 further has in the above-described construction a construction wherein in the fixed magnetic structure portion 2 thereof the amorphous magnetic layer 5 is joined to the order antiferromagnetic layer 1 via a second crystalline ferromagnetic intermediate layer 62. In FIG. 2, the portions corresponding to those in FIG. 1 are denoted by like reference numerals and duplex explanation is omitted.

The amorphous magnetic layer 5 can be made of a magnetic alloy containing therein Co, for example, at least one selected from the group consisting of CoFeB, CoFeZr, CoZrTa, CoZrNb, CoNb, CoZr, CoTa, and CoNbTa.

Also, each of the first and second crystalline ferromagnetic intermediate layers 61 and 62 can be constituted by a crystalline ferromagnetic layer having a main component, e.g., containing 95 weight % or more, of NiFe, Co, and CoFe.

Also, according to the necessity, between the amorphous magnetic layer 5 and the first crystalline ferromagnetic intermediate layer 61 of the fixed magnetic structure 2, there can be inserted a non-magnetic bond layer.

The ordered antiferromagnetic layer can be constituted, for example, by at least one selected from the group consisting of PtMn, NiMn, IrMn, PdMn, PdPtMn, and RhMn.

Also, preferably, the film thickness ratio of the amorphous magnetic layer to the first crystalline ferromagnetic intermediate layer is 1:3.

Each of the above-described layers can be formed using a known forming method, e.g., sputtering.

Figure 3:
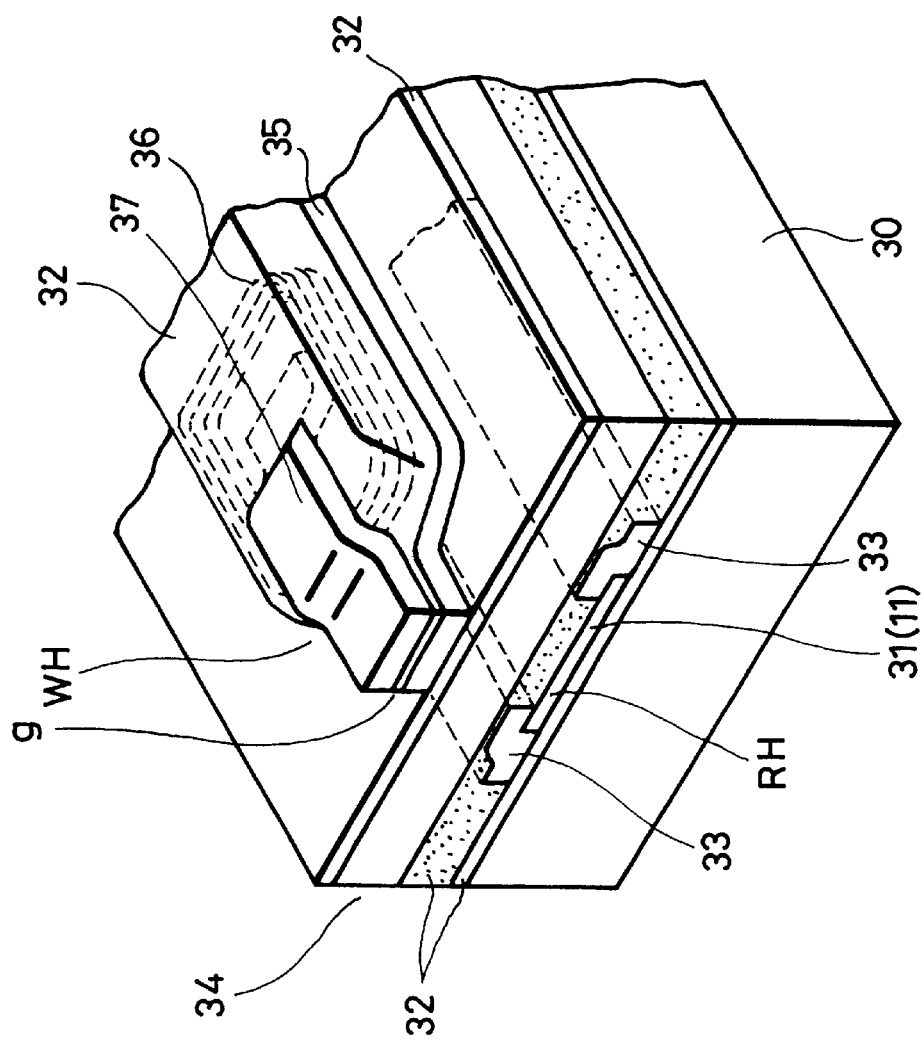
FIG. 3 is a schematic perspective view illustrating an example of a magnetic read sensor according to the present invention.

Also, as has an example of its embodiment illustrated in a perspective view of FIG. 3, a magnetic read sensor having a magneto-sensitive portion according to the present invention can be constructed as a reproduction head portion RH or the like used with respect to each of various kinds of magnetic recording media. And this magneto-sensitive portion 31 is constructed of the above-described magnetoresistance film 11 according to the present invention.

While an explanation will hereafter be given of embodiments of the magnetoresistance film according to the present invention, the invention is not limited thereto.

First Embodiment

In this first embodiment, as illustrated in FIG. 1, on a glass substrate 12 there is formed a backing layer 13 made of Ta and having a thickness of 5 nm. And on the resulting structure there are formed a magnetic layer 41 made of NiFe and having a thickness of 3.8 nm and a magnetic layer 42 made of CoFe and having a thickness of 2.0 nm. On the resulting structure there is formed a non-magnetic conductive layer 3 made of Cu and having a thickness of 2.5 nm. And on the resulting structure there is a fixed magnetic structure portion 2 that is composed of a first cystalline ferromagnetic intermediate layer 61 made of CoFe and having a thickness of 1.1 nm and an amorphous magnetic layer 5 made of CoFeZr and having a thickness of 1.1 nm. On this fixed magnetic structure portion 2 there is formed an ordered antiferromagnetic layer 1 made of PtMn and having a thickness of 20 nm. And on the resulting structure there is formed a surface layer 14 for protecting the surface of the structure, etc. that is made of Ta and having a thickness of 10 nm. Namely, this embodiment has a construction of substrate/Ta/NiFe/CoFe/Cu/CoFe/CoFeZr/PtMn/Ta. And each of these layers has been formed by sputtering.

Figure 4A:
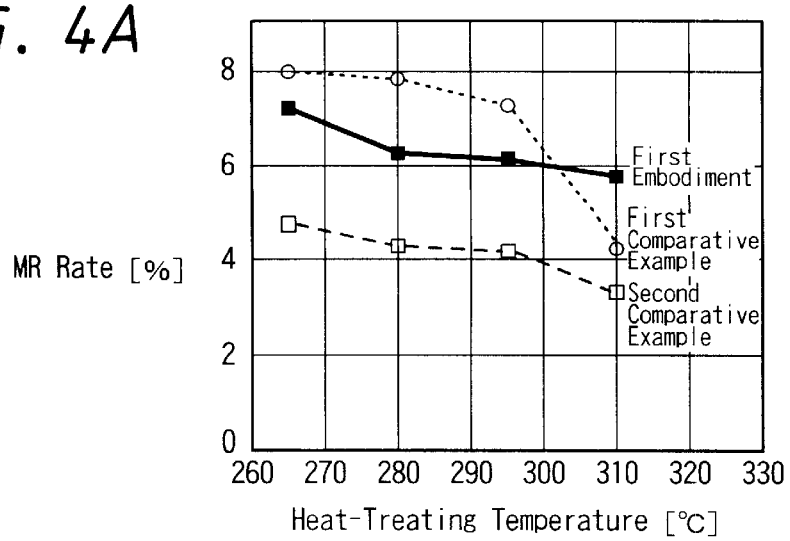
FIGS. 4A to 4C are graphic diagrams each illustrating the measurement results of a magnetoresistance change rate (MR rate) with respect to heat-treating temperatures of the magnetoresistance film.
Figure 5A:
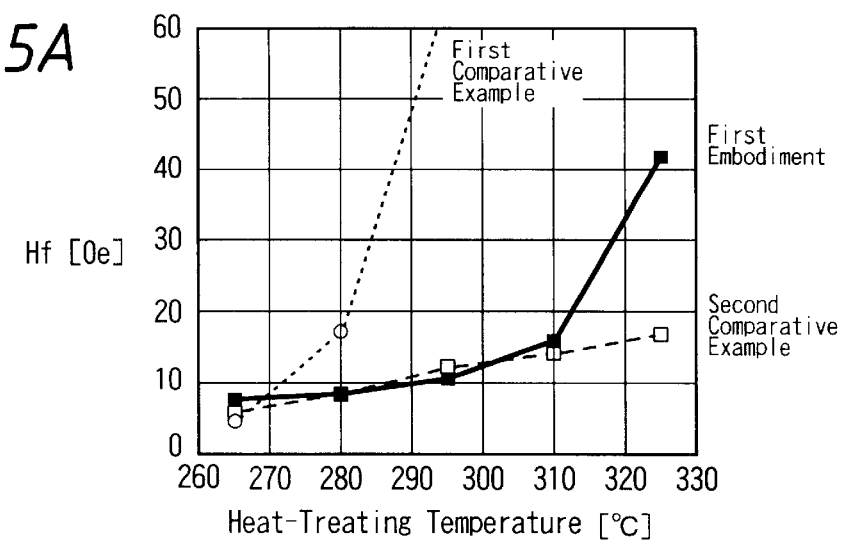
FIGS. 5A to 5C are graphic diagrams each illustrating the measurement results of a layer-to-layer coupling magnetic field (Hf) with respect to heat-treating temperatures of the magnetoresistance film.

Regarding the same samples each of that consists of the magnetoresistance film of this first embodiment, heat treatment was sequentially performed thereon at 265° C., 280° C., 295° C., 310° C., and 325° C. After each heat treatment, measurement was performed of the magneto-resistance change rate MR as expressed in % and the layer-to-layer bond magnetic field Hf, the results being shown in FIGS. 4A and 5A by being plotted with the marks "■".

Second Embodiment

In place of the amorphous magnetic layer 5 made of CoFeZr, that constituted the fixed magnetic structure portion 2 of the first embodiment, the portion 2 was constructed using the amorphous magnetic layer 5 made of CoZrTa and having a thickness of 1.1 nm. The construction of other structure portions was made the same as that in the first embodiment. Namely, this second embodiment has a construction of substrate/Ta/NiFe/CoFe/Cu/CoFe/CoZrTa/PtMn/Ta.

Figure 4B:
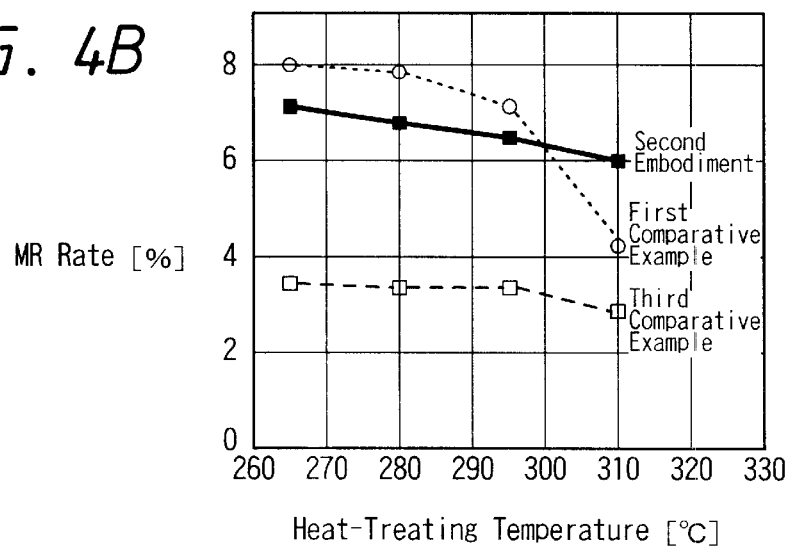
Figure 5B:
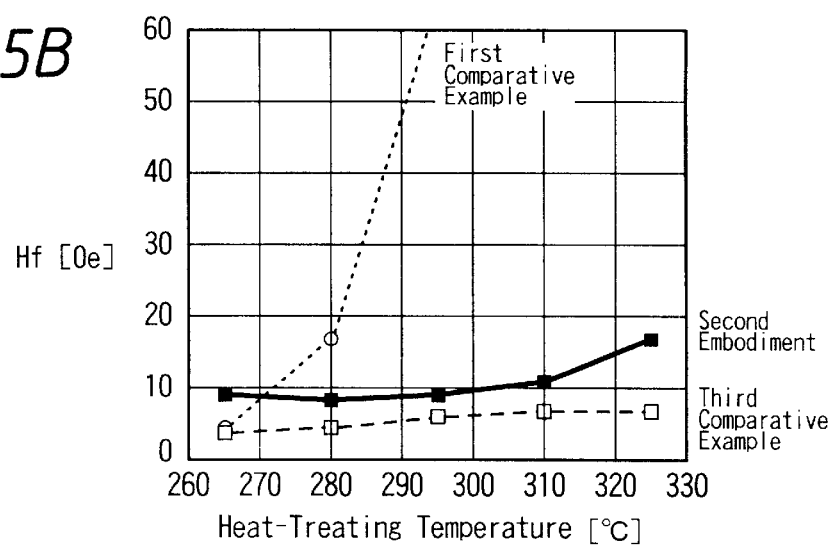

Regarding the same samples each of that consists of the magnetoresistance film of this second embodiment, heat treatment was sequentially performed thereon at 265° C., 280° C., 295° C., 310° C., and 325° C. After each heat treatment, measurement was performed of the magneto-resistance change rate MR as expressed in % and the layer-to-layer bond magnetic field Hf, the results being shown in FIGS. 4B and 5B by being plotted with the marks "■".

Third Embodiment

In place of the amorphous magnetic layer 5 made of CoFeZr, that constituted the fixed magnetic structure portion 2 of the first embodiment, the portion 2 was constructed using the amorphous magnetic layer 5 made of CoFeB and having a thickness of 1.1 nm. The construction of other structure portions was made the same as that in the first embodiment. Namely, this third embodiment has a construction of substrate/Ta/NiFe/CoFe/Cu/CoFe/CoFeB/PtMn/Ta.

Figure 4C:
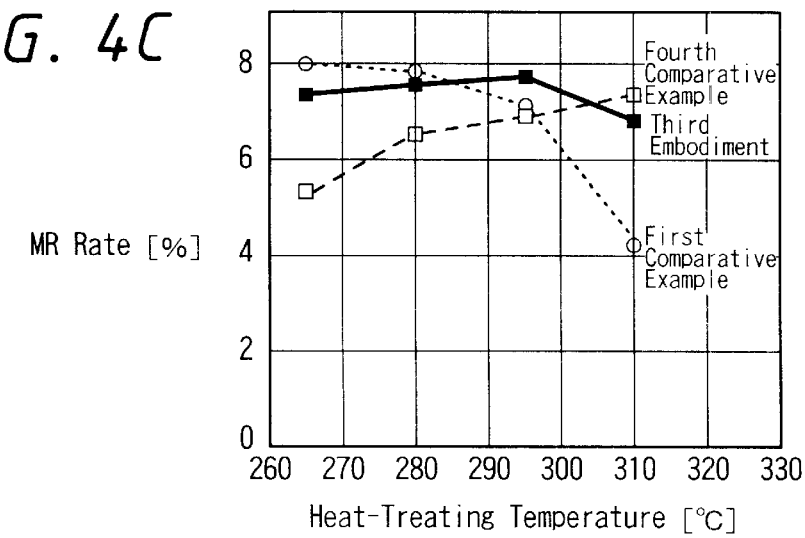
Figure 5C:
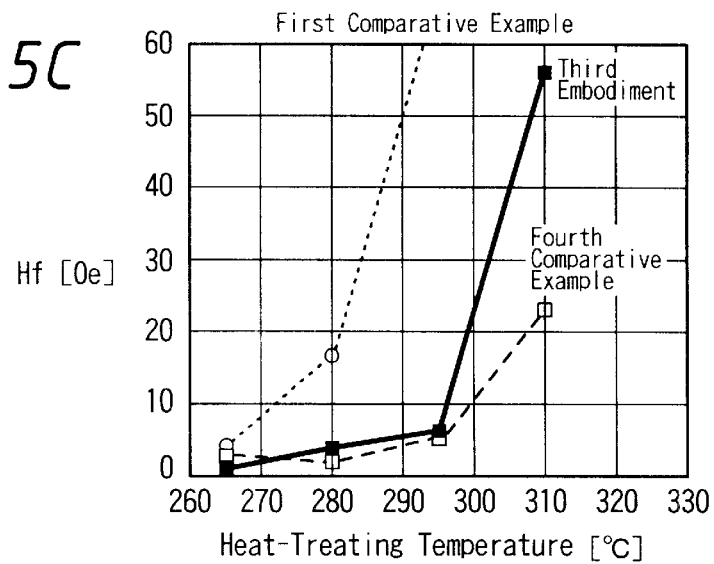

Regarding the same samples each of that consists of the magnetoresistance film of this third embodiment, heat treatment was sequentially performed thereon at 265° C., 280° C., 295° C., and 310° C. After each heat treatment, measurement was performed of the magneto-resistance change rate MR as expressed in % and the layer-to-layer bond magnetic field Hf, the results being shown in FIGS. 4C and 5C by being plotted with the marks "■".

FIRST COMPARATIVE EXAMPLE

The fixed magnetic structure portion 2 in the construction of the first embodiment was constructed using only a material made of CoFe and having a thickness of 2.2 nm alone. Except for this, the construction was made the same as that in the first embodiment. Namely, this first comparative example has a construction of substrate/Ta/NiFe/CoFe/Cu/CoFe/PtMn/Ta.

In the magnetoresistance film of this first comparative example, regarding the same samples, heat treatment was sequentially performed thereon at 265° C., 280° C., 295° C., and 310° C. After each heat treatment, measurement was performed of the magneto-resistance change rate MR as expressed in % and the layer-to-layer bond magnetic field Hf, the results being shown in FIGS. 4A to C and 5A to C each by being plotted with the mark "○".

SECOND COMPARATIVE EXAMPLE

This second comparative example has a construction having abated therefrom the first crystalline ferromagnetic intermediate layer 61 that constituted the fixed magnetic structure portion 2 of the first embodiment. Namely, this second comparative example has a construction of substrate/Ta/NiFe/CoFe/Cu/CoFeZr/PtMn/Ta.

In the magnetoresistance film of this second comparative example, regarding the same samples, heat treatment was sequentially performed thereon at 265° C., 280° C., 295° C., 310° C., and 325° C. After each heat treatment, measurement was performed of the magneto-resistance change rate MR as expressed in % and the layer-to-layer bond magnetic field Hf, the results being shown in FIGS. 4A and 5A each by being plotted with the mark "□".

THIRD COMPARATIVE EXAMPLE

This third comparative example has a construction having abated therefrom the first crystalline ferromagnetic intermediate layer 61 that constituted the fixed magnetic structure portion 2 of the second embodiment. Namely, this third comparative example has a construction of substrate/Ta/NiFe/CoFe/Cu/CoZrTa/PtMn/Ta.

In the magnetoresistance film of this third comparative example, regarding the same samples, heat treatment was sequentially performed thereon at 265° C., 280° C., 295° C., 310° C., and 325° C. After each heat treatment, measurement was performed of the magneto-resistance change rate MR as expressed in % and the layer-to-layer bond magnetic field Hf, the results being shown in FIGS. 4B and 5B each by being plotted with the mark "□".

FOURTH COMPARATIVE EXAMPLE

This fourth comparative example has a construction having abated therefrom the first crystalline ferromagnetic intermediate layer 61 that constituted the fixed magnetic structure portion 2 of the third embodiment. Namely, this fourth comparative example has a construction of substrate/Ta/NiFe/CoFe/Cu/CoFeB/PtMn/Ta.

In the magnetoresistance film of this fourth comparative example, regarding the same samples, heat treatment was sequentially performed thereon at 265° C., 280° C., 295° C., and 310° C. After each heat treatment, measurement was performed of the magneto-resistance change rate MR as expressed in % and the layer-to-layer bond magnetic field Hf, the results being shown in FIGS. 4C and 5C each by being plotted with the mark "□".

It is to be noted that when measuring the MR, regarding the heat treatment of 325° C., no measurement was made.

As is apparent from FIGS. 4A–5C, in the first comparative example in which the amorphous magnetic layer 5 is not provided in the fixed magnetic structure portion 2, in the heat treatment performed at a temperature of 265° C. or less, the MR rate is as high as approximately 8%. On the other hand, the Hf is as low as 10 [Oe] or less. However, as the heat-treating temperature rises, the MR rate remarkably decreases while the Hf sharply increases and exhibits a value that is as great as 60 [Oe].

Also, in the magnetoresistance film of the second to fourth comparative examples having no crystalline ferromagnetic intermediate layer provided therein, even in the high-temperature heat treatment of 300° C. or so, no sharp change is seen in the MR rate and Hf. Therefore, this magnetoresistance film certainly has excellent heat resistance. But the MR rate has a value that is as small as 4.5%, 3.3%, and 7%.

In contrast to this, in the construction of the present invention, wherein the first crystalline ferromagnetic intermediate layer 61 made of CoFe is joined between the amorphous magnetic layer 5 of the fixed magnetic structure portion 2 and the non-magnetic conductive layer 3, even in the high-temperature heat treatment of 300° C. or so, no remarkable decrease is seen in the MR rate. Nor is observed a sharp increase in the Hf. Namely, it is seen that the magnetoresistance film of the present invention has excellent heat resistance. And at the time of that heat treatment the MR rate has values of approximately 6.5%, 6.8%, and 7.8%, namely, the magnetoresistance film exhibits high MR rates compared to the second and third comparative examples having no crystalline ferromagnetic intermediate layer 61 provided therein.

Namely, the magnetoresistance film according to the present invention has excellent heat resistance and simultaneously enables obtaining a high MR rate.

Fourth Embodiment

Figure 6:
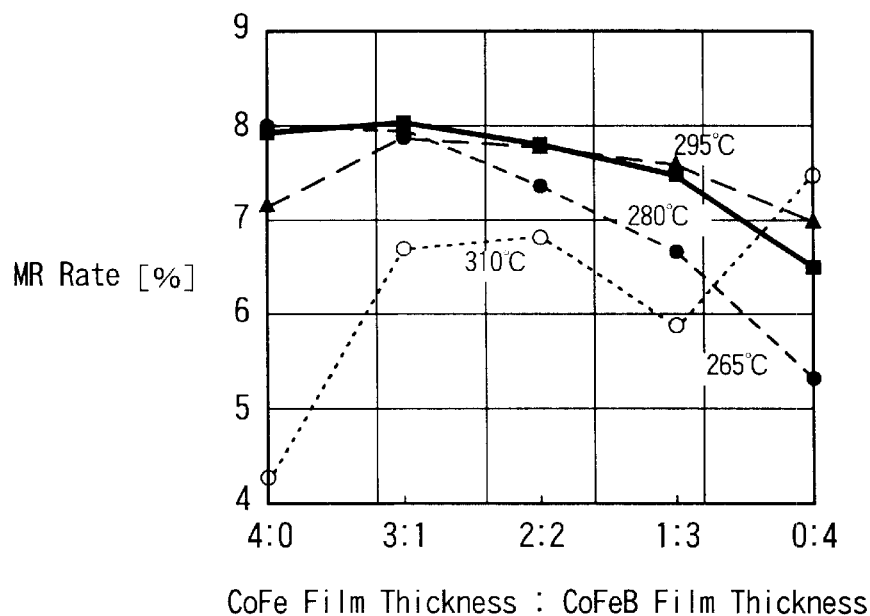
FIG. 6 is a graphic diagram illustrating the results of measurement that is made on the dependency upon temperatures of the relationship between the ratio in thickness, between a crystalline ferromagnetic intermediate layer (CoFe layer) and an amorphous magnetic layer (CoFeB layer) in a fixed magnetic structure portion, and the MR rate.
Figure 7:
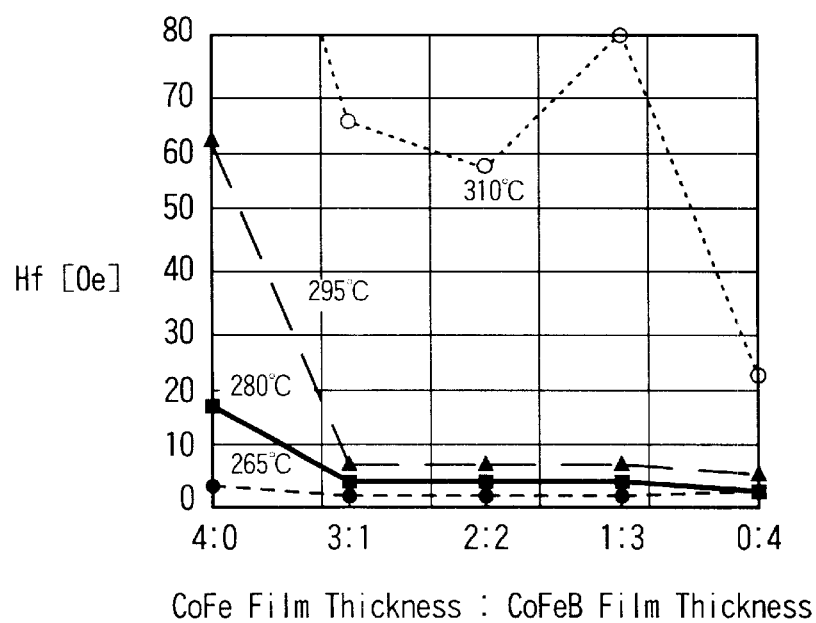
FIG. 7 is a graphic diagram illustrating the results of measurement that is made on the dependency upon temperatures of the relationship between the ratio in thickness, between the crystalline ferromagnetic intermediate layer (CoFe layer) and the amorphous magnetic layer (CoFeB layer) in the fixed magnetic structure portion, and the Hf.

In the construction of the third embodiment, the ratio in thickness between the crystalline ferromagnetic intermediate layer 61 made of CoFe and the amorphous magnetic layer 5 made of CoFeB, both constituting the fixed magnetic structure portion 2, was varied after the fashion of 4:0, 3:1, 2:2, 1:3, and 0:4 (namely, no crystalline ferromagnetic intermediate layer). And measurement was made of the respective dependencies of the MR rates and the Hf values of the resulting films upon the heat-treating temperatures, the results being shown in FIGS. 6 and 7. In FIGS. 6 and 7, the marks "●", the marks "■", the marks "▲" that each are blackened, and the marks "○" respectively represent the plotted measurement results obtained when the temperature is 265° C., 280° C., 295° C., and 310° C.

From FIGS. 6 and 7 it is seen that the dependencies of the MR rates and the Hf values upon the temperatures can be controlled by selectively determining the ratio in thickness between the crystalline ferromagnetic intermediate layer and the amorphous magnetic layer. And, when the ratio in thickness is to an extent of 3:1, the MR ratio has a value that is as high as approximately 8% with respect to the heat-treating temperature of 265° C. to 295° C. On the other hand, the Hf also has a small value up to 295° C. or so.

Fifth Embodiment

This embodiment is the one that has a construction, a schematic sectional view of that is illustrated in FIG. 2. In this case, the fixed magnetic structure portion 2 is constructed of the first crystalline ferromagnetic intermediate layer 61, the amorphous magnetic layer 5, and the second crystalline ferromagnetic intermediate layer 62. The first crystalline ferromagnetic intermediate layer 61 is constituted by a crystalline CoFe layer, the amorphous magnetic layer 5 is constituted by a CoFeB layer, and the second crystalline ferromagnetic intermediate layer 62 is constituted by a crystalline NiFe layer. Other construction portions are made the same as those in the first embodiment.

Namely, this fifth embodiment has a construction of substrate/Ta/NiFe/CoFe/Cu/CoFe/CoFeB/NiFe/PtMn/Ta.

Figure 8:
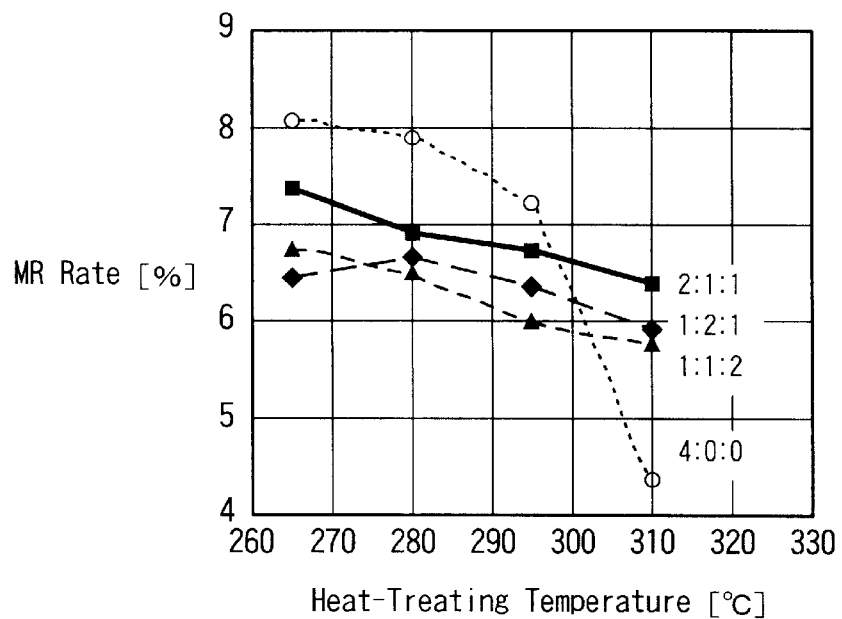
FIG. 8 is a graphic diagram illustrating the results of measurement made on the relationship between the heat-treating temperatures and the MR rates of the magnetoresistance film by using as parameters the ratios in thickness among the first crystalline ferromagnetic intermediate layer, the amorphous magnetic layer, and the second crystalline ferromagnetic intermediate layer in the fixed magnetic structure portion.
Figure 9:
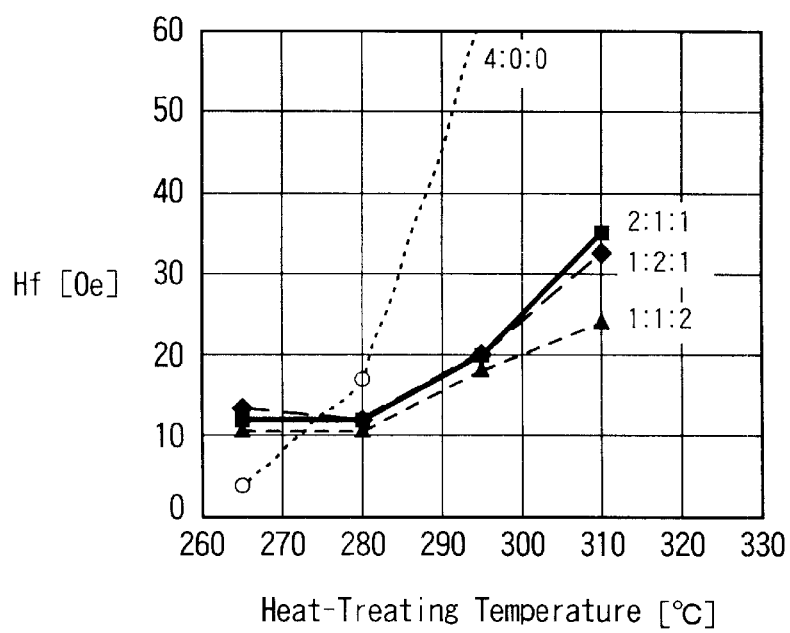
FIG. 9 is a graphic diagram illustrating the results of measurement made on the relationship between the heat-treating temperatures and the Hf values of the magnetoresistance film by using as parameters the ratios in thickness among the first crystalline ferromagnetic intermediate layer, the amorphous magnetic layer, and the second crystalline ferromagnetic intermediate layer in the fixed magnetic structure portion.

And in this construction, the ratio in thickness among the first crystalline ferromagnetic intermediate layer 61 (CoFe), the amorphous magnetic layer 5 (CoFeB), and the second crystalline ferromagnetic intermediate layer 62 (NiFe) was varied after the fashion of 2:1:1, 1:2:1, 1:1:2, and 4:0:0 (a case with the first crystalline ferromagnetic intermediate layer 61 only). And regarding each of these cases measurement was made of the respective MR rates and Hf values of the resulting films, the results being shown in FIGS. 8 and 9. In FIGS. 8 and 9, the marks "■", the marks "◆", the marks "▲" that each are blackened, and the marks "○" respectively correspond to the cases of 2:1:1, 1:2:1, 1:1:2, and 4:0:0.

In this way, in the case of providing the second crystalline ferromagnetic intermediate layer 62, also, the heat resistance is improved.

As described above, the magnetoresistance film according to the present invention enables improving the heat resistance while raising the MR rate.

Also, as another embodiment of the magnetoresistance film 11 according to the present invention, in the fixed magnetic structure portion 2, for example, a Ru layer serving as a non-magnetic bond layer can be also inserted between the amorphous magnetic layer 5 and the crystalline ferromagnetic intermediate layer 61 or 62, thereby making up the portion 2 as the one having a construction wherein the magnetization of one of the both layers and that of the other thereof are separated from each other. Namely, for example, in a case where applying this another embodiment to the above-described first embodiment, it is possible to construct the film 11 into a form of substrate/Ta/NiFe/CoFe/Cu/CoFe/Ru/CoFeZr/PtMn/Ta.

It is to be noted that the magnetoresistance film 11 according to the present invention is not limited to the above-described examples and the above-described embodiments. For instance, in each of the above-described examples and embodiments, reference has been made to the case where the substrate 12 is disposed on the side of the free magnetic layer portion 4. However, needless to say, it is possible to make up the film 11 as having a construction wherein the substrate 12 is disposed on the side of the ordered antiferromagnetic layer.

And, as described above, in the magnetoresistance film according to the present invention, the heat resistance is improved while the MR rate is being raised. Therefore, when constructing the film as a magnetic read sensor such as a magneto-sensitive portion of a reproduction head or the like used with respect to a magnetic recording medium, it is possible to obtain a high level of sensitivity.

An example of an embodiment of the magnetic read sensor according to the present invention will now be explained with reference to FIG. 3. In this example, illustration is made of a structure case of having a composite construction wherein there is constructed a recording/reproduction head that has the magnetic read sensor of the present invention, namely a magnetoresistance type reproduction head portion RH and that has an induction type thin film recording head portion WH. However, the magnetic read sensor can be also used only in a reproduction head construction.

In the example illustrated in FIG. 3, on a substrate 30 consisting of a magnetic material, if this material has conductivity, there is formed a magneto-sensitive portion 31 using the magnetoresistance film 11 according to the present invention via an insulative layer 32. To each end of this magneto-sensitive portion 31 there is adhered an electrode 33. On the resulting structure there is further joined a magnetic-material substrate 34 via an insulative layer 32. Thereby, a spin valve type magnetoresistance type reproduction head portion RH is constructed.

On the magnetic-material substrate 34, if this substrate has conductivity, similarly, there is formed a lower layer magnetic core 35 consisting of a magnetic layer via, for example, an insulative layer 32. On the resulting structure there is formed a thin film coil 36, for example, via an insulative layer. On the resulting structure there is further formed an upper layer magnetic core 37 consisting of a magnetic layer via an insulative layer 32. Forward ends of the both magnetic cores 35 and 37 are made to oppose each other with a non-magnetic layer of a required thickness existing in between, whereby a magnetic gap (g) is formed.

Also, in its rear portion, the upper layer magnetic core 37 is magnetically coupled, at a central portion of the thin film coil 32, to the lower layer magnetic core 35. As a result of this, there is formed a closed magnetic circuit having formed therein the magnetic gap (g) by the lower layer magnetic core 35 and the upper layer magnetic core 37. Thereby, an induction type thin film recording head WH is constructed.

The magneto-sensitive portion 31 and the magnetic gap (g) are formed being faced to their contact surfaces with, or their opposing surfaces to, a magnetic recording medium (not illustrated) for performing magnetic recording therein and magnetic reading therefrom.

The magnetic read sensor according to the present invention, in this example the magnetic head, especially the reproduction head, has its magneto-sensitive portion 31 constructed using the magnetoresistance film 11 that is high in the above-described MR rate and is excellent in the heat resistance. Therefore, it is possible to construct a head that has excellent reproduction sensitivity and that even when manufactured or even in a high-temperature environment in a state of its thereafter-succeeding use has a stable reproduction characteristic.

It is to be noted that, in the above-described example, reference has been made to the case where there is constructed a composite head having the thin film recording magnetic head integrated therein. However, it is also possible to construct a single-piece head that consists singly of a reproduction head. Also, the structure of the reproduction head portion RH also is not limited to the one that has been described above. Further, the head is not limited to a reproduction head with respect to the magnetic recording medium, and the invention sensor can be applied to magnetic read sensors for performing various types of magnetic detection.

As described above, the magnetoresistance film according to the present invention can eliminate the inconvenience that when this film has been constructed such that the fixed magnetic structure portion has provided therein the amorphous magnetic layer the magneto-resistance change rate MR decreases. Further, the magnetoresistance film according to the present invention can solve the problem of heat resistance when having made up the fixed magnetic structure portion into a single-layer structure consisting of a crystalline ferromagnetic layer.

Accordingly, the degree of freedom in the process of heat treatment becomes increased. Also, the controllability of manufacture becomes easy, and also the decrease in the MR rate due to the heat treatment becomes prevented. Therefore, it is possible to increase the output of the magnetic read sensor. Also, because it is possible to avoid the remarkable increase in the layer-to-layer coupling magnetic field Hf due to the heat treatment, the controllability of the bias point can be enhanced.

Also, when, in the magnetoresistance film of the present invention, there is made up a structure of providing the second crystalline ferromagnetic intermediate layer between the ordered antiferromagnetic layer and the amorphous magnetic layer, the resulting film enables obtaining a stable operation. Namely, by selectively determining the material constituting this second crystalline ferromagnetic intermediate layer, it is possible to prepare a high magnitude of coupling magnetic field between the amorphous magnetic layer and the ordered antiferromagnetic layer. And this provides a stable operation.

Accordingly, the magnetic read sensor of the present invention, the magneto-sensitive portion of that is constructed of the magnetoresistance film of the present invention, enables constructing a highly reliable magnetic read sensor having excellent sensitivity and stability.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A magnetoresistance film comprising:
    an ordered antiferromagnetic layer, a fixed magnetic structure portion joined thereto, a non-magnetic conductive layer, and a free magnetic layer portion having at least one magnetic layer, the fixed magnetic structure portion having provided therein an amorphous magnetic layer, whereby
    the amorphous magnetic layer and the non-magnetic conductive layer are joined to each other with a first crystalline ferromagnetic intermediate layer existing in between.

2. A magnetoresistance film according to claim 1, wherein the amorphous magnetic layer of the fixed magnetic structure portion is joined to the ordered antiferromagnetic layer with a second crystalline ferromagnetic intermediate layer existing in between.

3. A magnetoresistance film according to claim 2, wherein the second crystalline ferromagnetic intermediate layer consists of a ferromagnetic layer having NiFe, Co, and CoFe as main components.

4. A magnetoresistance film according to claim 2, wherein a non-magnetic coupling layer is inserted between the amorphous magnetic layer and the second crystalline ferromagnetic intermediate layer of the fixed magnetic structure portion.

5. A magnetoresistance film according to claim 1, wherein the amorphous magnetic layer is made of a magnetic alloy containing therein Co.

6. A magnetoresistance film according to claim 1, wherein the amorphous magnetic layer is made of at least one selected from the group consisting of CoFeB, CoFeZr, CoZrTa, CoZrNb, CoNb, CoZr, CoTa, and CoNbTa.

7. A magnetoresistance film according to claim 1, wherein the first crystalline ferromagnetic intermediate layer consists of a ferromagnetic layer having NiFe, Co, and CoFe as main components.

8. A magnetoresistance film according to claim 1, wherein a non-magnetic coupling layer is inserted between the amorphous magnetic layer and the first crystalline ferromagnetic intermediate layer of fixed magnetic structure portion.

9. A magnetoresistance film according to claim 1, wherein the ordered antiferromagnetic layer is made of at least one selected from the group consisting of PtMn, NiMn, IrMn, PdMn, PdPtMn, and RhMn.

10. A magnetic read sensor having a magneto-sensitive portion,
    the magneto-sensitive portion having a magnetoresistance film, which having an ordered antiferromagnetic layer, a fixed magnetic structure portion joined thereto, a non-magnetic conductive layer, and a free magnetic layer portion having at least one magnetic layer, the fixed magnetic structure portion having provided therein an amorphous magnetic layer, whereby
    the amorphous magnetic layer and the non-magnetic conductive layer are joined to each other with a first crystalline ferromagnetic intermediate layer existing in between.

11. A magnetic read sensor according to claim 10, wherein the amorphous magnetic layer of the fixed magnetic structure portion is joined to the ordered antiferromagnetic layer with a second crystalline ferromagnetic intermediate layer existing in between.

12. A magnetic read sensor according to claim 11, wherein the second crystalline ferromagnetic intermediate layer consists of a ferromagnetic layer having NiFe, Co, and CoFe as main components.

13. A magnetic read sensor according to claim 11, wherein a non-magnetic coupling layer is inserted between the amorphous magnetic layer and the second crystalline ferromagnetic intermediate layer of the fixed magnetic structure portion.

14. A magnetic read sensor according to claim 10, wherein the amorphous magnetic layer is made of a magnetic alloy containing therein Co.

15. A magnetic read sensor according to claim 10, wherein the amorphous magnetic layer is made of at least one selected from the group consisting of CoFeB, CoFeZr, CoZrTa, CoZrNb, CoNb, CoZr, CoTa, and CoNbTa.

16. A magnetic read sensor according to claim 10, wherein the first crystalline ferromagnetic intermediate layer consists of a ferromagnetic layer having NiFe, Co, and CoFe as main components.

17. A magnetic read sensor according to claim 10, wherein a non-magnetic coupling layer is inserted between the amorphous magnetic layer and the first crystalline ferromagnetic intermediate layer of the fixed magnetic structure portion.

18. A magnetic read sensor according to claim 10, wherein the ordered antiferromagnetic layer is made of at least one selected from the group consisting of PtMn, NiMn, IrMn, PdMn, PdPtMn, and RhMn.

* * * * *